(12) United States Patent
Oh

(10) Patent No.: US 10,121,545 B2
(45) Date of Patent: Nov. 6, 2018

(54) SEMICONDUCTOR MEMORY DEVICE AND OPERATING METHOD FOR INHIBITING PROGRAMMING

(71) Applicant: SK hynix Inc., Gyeonggi-do (KR)

(72) Inventor: Hae Soon Oh, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/130,593

(22) Filed: Apr. 15, 2016

(65) Prior Publication Data

US 2017/0148520 A1   May 25, 2017

(30) Foreign Application Priority Data

Nov. 23, 2015   (KR) .................. 10-2015-0163835

(51) Int. Cl.
*G11C 16/12* (2006.01)
*G11C 16/34* (2006.01)
*G11C 16/10* (2006.01)
G11C 16/04 (2006.01)

(52) U.S. Cl.
CPC .............. *G11C 16/12* (2013.01); *G11C 16/10* (2013.01); *G11C 16/3427* (2013.01); *G11C 16/3459* (2013.01); *G11C 16/0483* (2013.01)

(58) Field of Classification Search
CPC ..................... G11C 16/12; G11C 16/3459
See application file for complete search history.

(56) References Cited

U.S. PATENT DOCUMENTS

| 9,218,874 B1* | 12/2015 | Koh ................... G11C 11/5628 |
| 2012/0020155 A1* | 1/2012 | Kim .................... G11C 11/5628 |
| | | 365/185.03 |
| 2013/0208543 A1* | 8/2013 | Park ....................... G11C 16/10 |
| | | 365/185.19 |
| 2016/0019949 A1* | 1/2016 | Raghunathan ...... G11C 11/5628 |
| | | 365/185.02 |

FOREIGN PATENT DOCUMENTS

| KR | 1020120059035 | 6/2012 |
| KR | 1020150000572 | 1/2015 |

\* cited by examiner

*Primary Examiner* — Pho M Luu
*Assistant Examiner* — Jerome Leboeuf
(74) *Attorney, Agent, or Firm* — IP & T Group LLP

(57) ABSTRACT

An operating method of a semiconductor memory device including a plurality of memory cells each having one of "n" number of program statuses as a target program status, the operating method comprising: setting a first group of the memory cells, which have a first group of the program statuses as the target program status, to a program permit mode; setting a second group of the memory cells, which have a second group of the program statuses as the target program status, to a program inhibit mode; performing a program operation and a program verification operation to an i-th one of the "n" program statuses in ascending order of level of the program statuses; and changing one or more of the memory cells of the first group of the memory cells having the i-th program status from the program permit mode to the program inhibit mode, and one or more of the memory cells of the second group of the memory cells having an (i+k)th program status to from the program inhibit mode to the program permit mode, upon success of the program verification operation to the i-th program status.

6 Claims, 14 Drawing Sheets

|  | PV1 | PV2 | PV3 | PV4 | PV5 | PV6 | PV7 |
|---|---|---|---|---|---|---|---|
| PV1 IN PROCESS | PGM MODE | PGM MODE | PGM MODE | INHIBIT MODE (PGM INCOMPLETION) | INHIBIT MODE (PGM INCOMPLETION) | INHIBIT MODE (PGM INCOMPLETION) | INHIBIT MODE (PGM INCOMPLETION) |
| PV2 IN PROCESS (PV1 COMPLETION) | INHIBIT MODE (PGM COMPLETION) | PGM MODE | PGM MODE | PGM MODE | INHIBIT MODE (PGM INCOMPLETION) | INHIBIT MODE (PGM INCOMPLETION) | INHIBIT MODE (PGM INCOMPLETION) |
| PV3 IN PROCESS (PV1,2 COMPLETION) | INHIBIT MODE (PGM COMPLETION) | INHIBIT MODE (PGM COMPLETION) | PGM MODE | PGM MODE | PGM MODE | INHIBIT MODE (PGM INCOMPLETION) | INHIBIT MODE (PGM INCOMPLETION) |
| PV4 IN PROCESS (PV1,2,3 COMPLETION) | INHIBIT MODE (PGM COMPLETION) | INHIBIT MODE (PGM COMPLETION) | INHIBIT MODE (PGM COMPLETION) | PGM MODE | PGM MODE | PGM MODE | INHIBIT MODE (PGM INCOMPLETION) |
| PV5 IN PROCESS (PV1,2,3,4 COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | PGM MODE | PGM MODE | PGM MODE |
| PV6 IN PROCESS (PV1,2,3,4,5 COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | PGM MODE | PGM MODE |
| PV7 IN PROCESS (PV1,2,3,4,5,6 COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | PGM MODE |

FIG. 6

| | PV1 | PV2 | PV3 | PV4 | PV5 | PV6 | PV7 |
|---|---|---|---|---|---|---|---|
| PGM EARLY STAGE (610) | PGM MODE | PGM MODE | PGM MODE | PGM MODE | PGM MODE | PGM MODE | PGM MODE |
| PGM MIDDLE STAGE (620) | INHIBIT MODE (PGM COMPLETION) | INHIBIT MODE (PGM COMPLETION) | PGM MODE | PGM MODE | PGM MODE | PGM MODE | PGM MODE |
| PGM LATE STAGE (630) | INHIBIT MODE (PGM COMPLETION) | INHIBIT MODE (PGM COMPLETION) | INHIBIT MODE (PGM COMPLETION) | INHIBIT MODE (PGM COMPLETION) | PGM MODE | PGM MODE | PGM MODE |

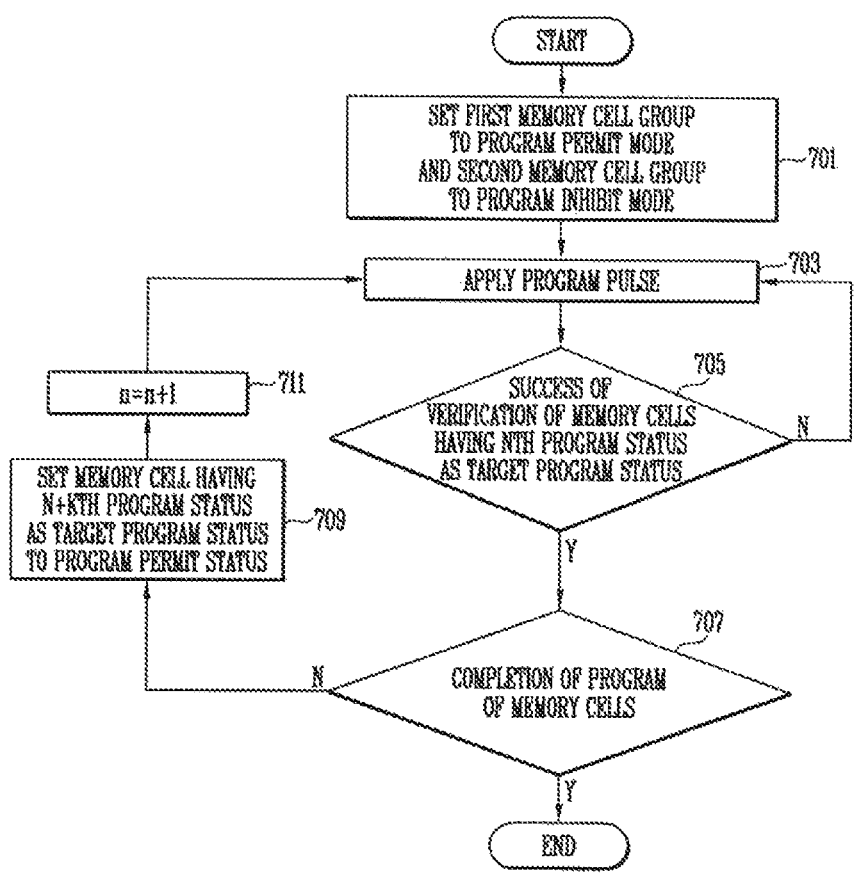

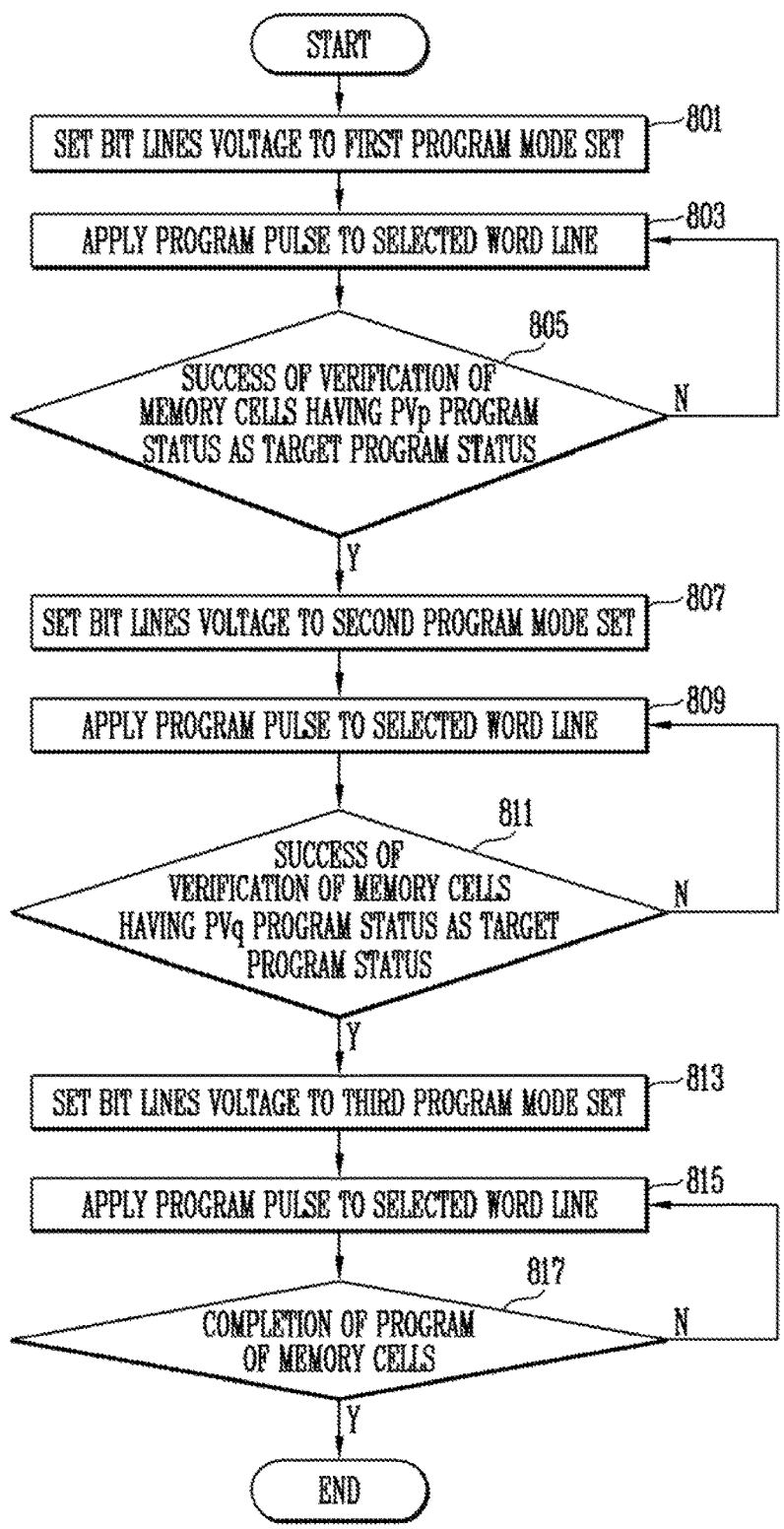

FIG. 10

| | PV1 | PV2 | PV3 | PV4 | PV5 | PV6 | PV7 |
|---|---|---|---|---|---|---|---|
| PV1 IN PROCESS | PGM MODE | PGM MODE | PGM MODE | INHIBIT MODE (PGM INCOMPLETION) | INHIBIT MODE (PGM INCOMPLETION) | INHIBIT MODE (PGM INCOMPLETION) | INHIBIT MODE (PGM INCOMPLETION) |
| PV2 IN PROCESS (PV1 COMPLETION) | INHIBIT MODE (PGM COMPLETION) | PGM MODE | PGM MODE | PGM MODE | INHIBIT MODE (PGM INCOMPLETION) | INHIBIT MODE (PGM INCOMPLETION) | INHIBIT MODE (PGM INCOMPLETION) |
| PV3 IN PROCESS (PV1,2 COMPLETION) | INHIBIT MODE (PGM COMPLETION) | INHIBIT MODE (PGM COMPLETION) | PGM MODE | PGM MODE | PGM MODE | INHIBIT MODE (PGM INCOMPLETION) | INHIBIT MODE (PGM INCOMPLETION) |
| PV4 IN PROCESS (PV1,2,3 COMPLETION) | INHIBIT MODE (PGM COMPLETION) | INHIBIT MODE (PGM COMPLETION) | INHIBIT MODE (PGM COMPLETION) | PGM MODE | PGM MODE | PGM MODE | INHIBIT MODE (PGM INCOMPLETION) |
| PV5 IN PROCESS (PV1,2,3,4 COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | PGM MODE | PGM MODE | PGM MODE |
| PV6 IN PROCESS (PV1,2,3,4,5 COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | PGM MODE | PGM MODE |
| PV7 IN PROCESS (PV1,2,3,4,5,6 COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | INHIBIT MODE (PGM COMPLETION) | PGM MODE |

FIG. 12

| | PV1 | PV2 | PV3 | PV4 | PV5 | PV6 | PV7 |
|---|---|---|---|---|---|---|---|
| PGM EARLY STAGE (1101) FIRST PROGRAM MODE | PGM MODE | PGM MODE | PGM MODE | INHIBIT MODE (PGM INCOMPLETION) | INHIBIT MODE (PGM INCOMPLETION) | INHIBIT MODE (PGM INCOMPLETION) | INHIBIT MODE (PGM INCOMPLETION)† |
| PGM MIDDLE STAGE (1103) SECOND PROGRAM MODE | INHIBIT MODE (PGM COMPLETION) | INHIBIT MODE (PGM COMPLETION) | PGM MODE | PGM MODE | PGM MODE | INHIBIT MODE (PGM INCOMPLETION) | INHIBIT MODE (PGM INCOMPLETION)‡ |
| PGM LATE STAGE (1105) THIRD PROGRAM MODE | INHIBIT MODE (PGM COMPLETION) | INHIBIT MODE (PGM COMPLETION) | INHIBIT MODE (PGM COMPLETION) | INHIBIT MODE (PGM COMPLETION) | PGM MODE | PGM MODE | PGM MODE |

† THE NUMBER OF APPLIED PULSE EXCEEDS FIRST REFERENCE VALUE

‡ THE NUMBER OF APPLIED PULSE EXCEEDS SECOND REFERENCE VALUE

100 # SEMICONDUCTOR MEMORY DEVICE AND OPERATING METHOD FOR INHIBITING PROGRAMMING

CROSS-REFERENCE TO RELATED APPLICATION

The present application claims priority under 35 U.S.C. 119(a) to Korean patent application number 10-2015-0163835, filed on Nov. 23, 2015, in the Korean Intellectual Property Office, the entire disclosure of which is herein incorporated by reference in its entirety.

BACKGROUND

1. Technical Field

An aspect of the present disclosure relates to an electronic apparatus, and more particularly, to a semiconductor memory device and an operating method thereof.

2. Related Art

A semiconductor memory device is a memory device embodied by using semiconductor, for example, silicon (Si), germanium (Ge), gallium arsenide (GaAs), indium phospide (InP), etc. A volatile memory device and a nonvolatile memory device are included in the semiconductor memory device.

The volatile memory device is a memory device in which stored data is eliminated when a power supply is blocked. A static RAM (SRAM), a dynamic RAM (DRAM) and a synchronous DRAM (SDRAM) are included in the volatile memory device. The nonvolatile memory device is the memory device which maintains the stored data when the power supply is blocked. A read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM) are included in the nonvolatile memory device. The flash memory is broadly classified as a NOR type and a NAND type.

SUMMARY

Embodiments of the present invention provide a semiconductor memory device exhibiting improved reliability and an operating method thereof.

According to an aspect of the present disclosure, there is provided an operating method of a semiconductor memory device including a plurality of memory cells each having one of "n" number of program statuses as a target program status, the operating method comprising: setting a first group of the memory cells, which have a first group of the program statuses as the target program status, to a program permit mode; setting a second group of the memory cells, which have a second group of the program statuses as the target program status, to a program inhibit mode; performing a program operation and a program verification operation to an i-th one of the "n" program statuses in ascending order of level of the program statuses; and changing one or more of the memory cells of the first group of the memory cells having the i-th program status from the program permit mode to the program inhibit mode, and one or more of the memory cells of the second group of the memory cells having an (i+k)th program status to from the program inhibit mode to the program permit mode, upon success of the program verification operation to the i-th program status.

According to an aspect of the present disclosure, there is provided an operating method of the semiconductor memory device including a plurality of memory cells each having one of "n" number of program statuses as a target program status, the operating method comprising: performing a program operation to the memory cells according to one of first to third program mode set until a first condition is met; performing the program operation to the memory cells according to another one of first to third program mode set until a second condition is met; and performing the program operation to the memory cells according to a remaining one of first to third program mode set.

According to an aspect of the present disclosure, there is provided a semiconductor memory device, comprising: a plurality of memory cells each having one of "n" number of program statuses as a target program status; and a peripheral circuit suitable for: setting a first group of the memory cells, which have a first group of the program statuses as the target program status, to a program permit mode; setting a second group of the memory cells, which have a second group of the program statuses as the target program status, to a program inhibit mode; performing a program operation and a program verification operation to an i-th one of the "n" program statuses in ascending order of level of the program statuses; and changing one or more of the memory cells of the first group of the memory cells having the i-th program status from the program permit mode to the program inhibit mode, and one or more of the memory cells of the second group of the memory cells having an (i+k)th program status to from the program inhibit mode to the program permit mode, upon success of the program verification operation to the i-th program status.

According to an aspect of the present disclosure, there is provided a semiconductor memory device, comprising: a plurality of memory cells each having one of "n" number of program statuses as a target program status; and a peripheral circuit suitable for: performing a program operation to the memory cells according to one of first to third program mode set until a first condition is met; performing the program operation to the memory cells according to another one of first to third program mode set until a second condition is met; and performing the program operation to the memory cells according to a remaining one of first to third program mode set.

BRIEF DESCRIPTION OF THE DRAWINGS

FIG. 6 is a diagram illustrating a voltage applied to bit lines for a target program status of memory cells during the program operation.

FIG. 7 is a flow chart illustrating an operating method of a semiconductor memory device according to an embodiment of the present disclosure.

FIG. 8 is a flow chart illustrating an operating method of a semiconductor memory device according to another embodiment of the present disclosure.

FIG. 10 is a diagram illustrating a voltage applied to a bit line when a semiconductor memory device operates according to an embodiment of FIG. 7.

FIG. 12 is a diagram illustrating a voltage applied to a bit line when a semiconductor memory device operates according to an embodiment of FIG. 9.

DETAILED DESCRIPTION

Figure 1:
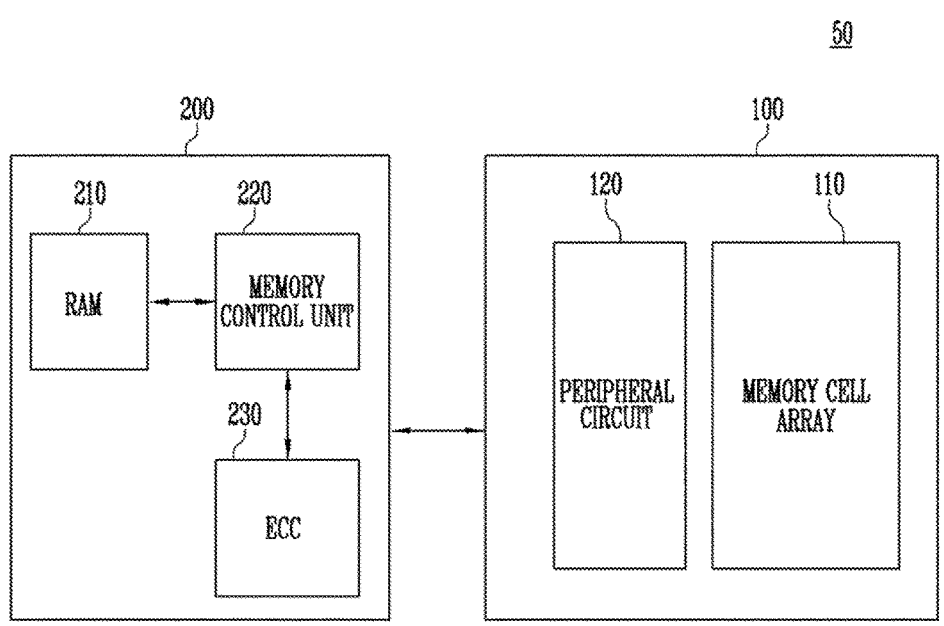
FIG. 1 is a block diagram illustrating a configuration of a memory system.

In the following detailed description, only certain example embodiments of the present invention have been shown for structural and functional description. However, the scope of the present invention is not limited to the detailed description of the specification but defined by the appended claims but it will be understood by those of skill in the art that various changes in form and details may be made without departing from the spirit and scope of the invention as set forth in the claims.

Embodiments are provided for fully disclosing the invention to those skilled in the art to which the invention pertains. The term "first," "second" and the like may be used to distinguish similar elements from one another, however, it is noted that these terms are not intended to limit these elements in any way. For example, a first element may be equally referred to as a second element and a second element may be referred to as a first element. Also a singular term includes the plural unless it is explicitly stated otherwise.

In the following detailed description, only certain example embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, it will be understood that when an element or layer is referred to as being "on," "coupled to," or "coupled to" another element or layer, it can be directly on, coupled or coupled to the other element or layer or intervening elements or layers may be present. In contrast, when an element is referred to as being "directly on," "directly coupled to," or "directly coupled to" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting the present disclosure. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments have been disclosed herein, and although specific structural or functional explanations are employed, they are used and are to be interpreted in a generic and descriptive sense only and not for purpose of limitation.

Hereinafter, embodiments of the invention will be described with reference to the accompanying figures in detail.

FIG. 1 is a block diagram illustrating a configuration of a memory system.

A memory system 50 includes a semiconductor memory device 100 and a controller 200.

The semiconductor memory device 100 may be or include a NAND flash memory, a vertical NAND, a NOR flash memory, a resistive random access memory (RRAM), a phase-change memory (PRAM), a magnetoresistive random access memory (MRAM), a ferroelectric random access memory (FRAM), and a spin transfer torque random access memory (STT-RAM) are included in a semiconductor memory device 100. In addition, the semiconductor memory device 100 of the present invention may be embodied by a three-dimensional array structure. The present invention may be applied to a flash memory device in which a charge storing layer is configured to be a floating gate (FG) in addition to a charge trap flash (CTF) in which the charge storing layer is configured to be an insulating layer.

The semiconductor memory device 100 may include a memory cell array 110 and a peripheral circuit 120 to drive the memory cell array 110. The memory cell array 110 may include a plurality of non-volatile memory cells. The memory cells may be grouped in units depending on their accessibility and or their purpose of use. For example, memory cells may be grouped in pages that can be accessed at once to read data from or write data into them. The pages may be grouped in memory blocks.

The memory cell array 100 may include a plurality of memory blocks and the plurality of memory blocks may be used as a system block and a user block according to a purpose of use.

A peripheral circuit 120 may operate responding to a control of a controller 200. The peripheral circuit 120 may respond to the control of the controller 200 and program data to the memory cell array 110. The peripheral circuit 120 may read data from the memory cell array 110 and operate to delete data of the memory cell array 110.

In various embodiments, a read operation and a program operation of the semiconductor memory device 100 may be performed on a per page basis. This means that data may not be read or written separately to an individual memory cell but to a group of memory cells forming a single page at the same time. A delete operation of the semiconductor memory device 100 may be performed on a per memory block basis. This means that data stored in memory cells cannot be erased separately one memory cell at a time or per page but only for all memory cells forming a memory block at the same time.

During the program operation, the peripheral circuit 120 may receive a command which represents the program operation, a physical address PA and write data from a controller 200. In the peripheral circuit 120, when one memory block and one page Included in the corresponding memory block selected by the physical address PA, the write data may be programmed to the selected page.

During a read operation, the peripheral circuit 120 may receive a command representing the read operation (hereafter, a read command) and a physical block address (PBA) from a controller 200. The peripheral circuit 120 may read the data from one memory block and one page included therein selected by the physical block address (PBA), and output read data (hereafter, page data) to the controller 200.

During a delete operation, the peripheral circuit 120 may receive a command representing a delete operation and the physical block address (PBA) from the controller 200. The physical block address (PBA) may specify one memory block. The peripheral 120 may delete data of a memory block corresponding to the physical block address (PBA).

The controller 200 may control a general operation of the semiconductor memory device 100. The controller 200 may access the semiconductor memory device 100 responding to a request from an external host. The controller 200 may control the operation of the semiconductor device 100 via the peripheral circuit 120 of the semiconductor memory device 100.

The controller 200 may be any suitable controller. For example, as shown in FIG. 1, the controller 200 may include a RAM 210, a memory controlling unit 200 and an error correcting circuit 230.

The random access memory (RAM) 210 may operate according to a control of the memory controlling unit 220, and used as a work memory, a buffer memory, and a cache memory. When the RAM 210 is used as the work memory, the data processed by the memory controlling unit 220 may be stored temporarily. When the RAM 220 is used as the buffer memory, the RAM 200 may be used for buffering the data which transmitted from a host (not shown) to the semiconductor memory device 100 or from the semiconductor memory device 100 to the host (not shown).

The memory control unit 220 may change a logical block address (LBA) received from the host to a physical block address (PBA). For example, the memory control unit 220 may be configured to control a read operation, a program operation, a delete operation or a background operation of the semiconductor memory device 100. The memory controlling unit 220 may be configured to drive a firmware to control the semiconductor memory device 100.

The memory controlling unit 220 may change a logical block address (LBA) which the host provides through a flash transformation layer (FTL) to the physical block address (PBA). In more detail, the flash transformation layer (FTL) may receive the logical block address (LBA) by using a mapping table and change the logical block address (LBA) to the physical block address (PBA). The physical block address (PBA) may be a page number indicating certain word line of the memory cell array 100. Any suitable mapping method may be used. A mapping method may for, example, include the use of a mapping table stored in the controller which may link the logical block addresses to corresponding physical block addresses. A mapping method may vary based on a mapping unit. The representative mapping method may include a page mapping method, a block mapping method and a hybrid mapping method.

The error correcting code (ECC) 230 may be any suitable circuit for detecting and correcting errors in the data read from or written to the memory device 100. For example, the ECC 230 may generate a parity of an Error Correction Code (ECC) corresponding to data to be programmed. In addition, during a read operation, the error correcting code circuit 230 may correct an error by using the parity corresponding to read page data. the error correcting code circuit 230 may correct an error by using a coded modulation, for example, a low density parity check (LDPC) code, a Bose, Chaudhri, Hocquenghem (BCH) Code, a turbo code, a Reed-Solomon code, a convolution code, a recursive systematic code (RSC), a trellis-coded modulation (TCM), a Block coded modulation (BCM), and a hamming code.

During the read operation, the error correcting code circuit 230 may correct the error of the read page data. When error bits exceeding the number of bits to be corrected are included in the read page data, a decode may fail. When error bits equal to or smaller than the number of the bits to be corrected are included in the read page data, a decode may succeed.

A success of decode may represent that the corresponding read command is passed. A failure of decode may represent that the corresponding read command is failed. When the decode succeeds, the controller 200 may output the page data in which the error is corrected to the host.

Figure 2:
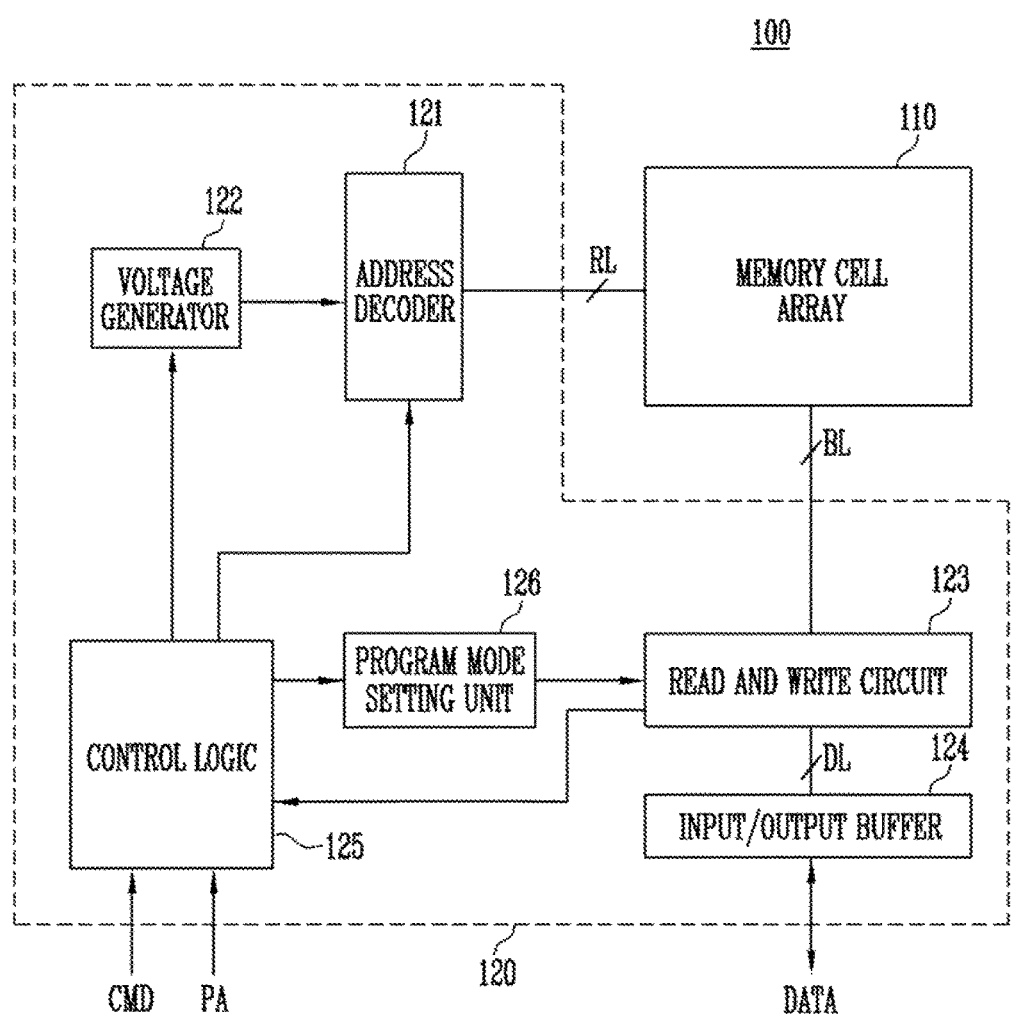
FIG. 2 is a block diagram illustrating a structure of a semiconductor memory device of FIG. 1.

FIG. 2 is a block diagram illustrating a structure of a semiconductor memory device 100 of FIG. 1.

Figure 3:
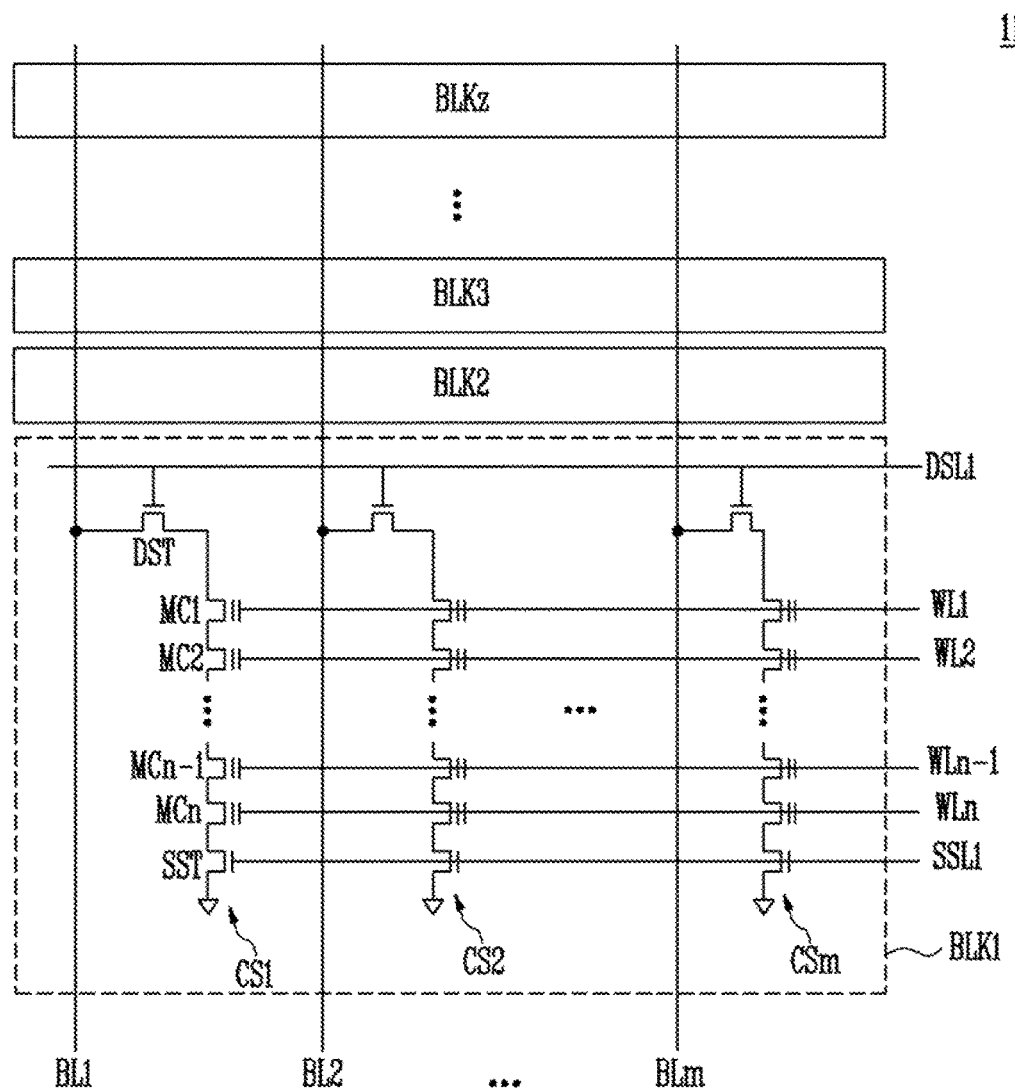
FIG. 3 is a diagram illustrating a structure of a memory cell array of FIG. 2.

FIG. 3 is a diagram illustrating a structure of a memory cell array 110 of FIG. 2.

Referring to FIG. 2, the semiconductor memory device 100 may include the memory cell array 110 and the peripheral circuit 120.

Referring to FIG. 2, the memory cell array 110 may include a plurality of memory blocks BLK1 to BLKz.

The plurality of memory cells Included in the memory cell array 110 may be used according to a purpose of use. The plurality of blocks may be divided into a main block and an extra block, and various setting information in connection with an operation of the memory cells may be stored in the extra block.

Referring to FIG. 3, the first memory block to a zth memory block BLK1 to BLKz may be commonly coupled to the first bit line to an m-th bit line BL1 to BLm. In FIG. 3, elements included in the first memory block BLK1 among a plurality of memory blocks BLK1 to BLKz are Illustrated for the convenience of explanation, and the elements included in each of the memory blocks BLK2 to BLKz are omitted. Each of the memory blocks BLK2 to BLKz may be configured same as the first memory block BLK1.

The first memory block BLK1 may Include a plurality of cell strings CS1_1 to CS1_m. Each of the first to m-th cell string CS1_1 to CS1_m may be coupled to the first to m-th bit lines BL1 to BLm, respectively.

Each of the first to m-th cell strings CS1_1 to CS1_m may include a drain selecting transistor DST, a plurality of memory cells MC1 to MCn coupled in series and a source selecting transistor SST. The drain selecting transistor DST may be coupled to a drain selecting line DSL1. The first to n-th memory cells MC1 to MCn may be coupled to first to n-th word lines WL1 to WLn, respectively. The source selecting transistor SST may be coupled to a source selecting line SSL1. A drain side of the drain selecting transistor DST may be coupled to corresponding bit line. The drain selecting transistors of the first to m-th cell strings CS1_1 to CS1_m may be coupled to the first to m-th bit lines BL1 to BLm, respectively. A source side of the source selecting transistor SST may be coupled to the common source line CSL. As an embodiment, the common source line CSL may be commonly coupled to the first to zth memory blocks BLK1 to BLKz.

A drain selecting line DSL1, the first to n-th word lines WL1 to WLn and a source selecting line SSL1 may be included in a row lines RL of FIG. 2. The drain selecting line DSL1, the first to n-th word lines WL1 to WLn and the source selecting line SSL1 may be controlled by an address decoder 121. The common source line CSL may be controlled by a control logic 125. The first to m-th bit lines BL1 to BLm may be controlled by a read and write circuit 123.

Referring to FIG. 2, the peripheral circuit 120 may include the address decoder 121, a voltage generator 122, the read and write circuit 123, an input/output buffer 124, a controlling logic 125 and a program mode setting unit 126.

The address decoder 121 may be coupled to the memory cell array through the row lines RL. The address decoder 121 may be configured to operate responding to a control of the control logic 125.

As an embodiment, the address decoder 121 may include an address buffer a block decoder and a row decoder.

The address decoder 121 may receive an address PA through the control logic 125. The program operation of the semiconductor memory device 100 may be performed by a unit of page. The physical block address PA received during the program operation may Include at least one of a block address or a row address. The physical block address PA received during the read program operation may include at least one of the block address or the row address.

The address decoder 121 may be configured to perform decoding the block address, among the received address PA. The address decoder 121 may select one memory block among the memory blocks BLK1 to BLKz according to decoded block address.

The address decoder 121 may be configured to perform decoding the row address, among the received physical block address PA and select one word lie, among the selected memory block. One page may be selected accordingly.

The address decoder 121 may select one word line of the selected memory block by applying voltages provided from the voltage generator 122 according to the decoded row address to the row lines RL. During the program operation, the address decoder 121 may apply a program pulse to the selected word line, and a pass pulse lower than the program pulse to the non-selected word lines. During the write operation, the address decoder 121 may apply a read voltage to the selected word line, and a first pass voltage and a second pass voltage to the non-selected word lines adjacent to the selected word line.

The voltage generator 122 may be configured to generate a plurality of voltages by using an external power voltage supplied to the semiconductor memory device 100. The voltage generator 122 may operate responding to a control of the control logic 125. For example, the voltage generator 122 may generate an internal power voltage by regulating the external power voltage. The internal power voltage generated in the voltage generator 122 may be provided to the address decoder 121, the read and write circuit 123, the input/output buffer 124, the control logic 125 and the program mode setting unit 126 and used as an operation voltage of the semiconductor memory device 100.

The voltage generator 122 may generate the plurality of voltages by using at least one of the external power voltage and the internal power voltage. As an embodiment, the voltage generator 122 may include a plurality of pumping capacitors which receives the internal power voltage, and generate the plurality of voltages by selectively actualizing the plurality of pumping capacitors responding to the control of the control logic 125. For example, the voltage generator 122 may generate the read voltage applied to the word line selected during the read operation and pass voltages applied to the non-selected word lines.

The read and write circuit 123 may be coupled to the memory cell array 110 through the bit lines BL. The read and write circuit 123 may operate responding to the control of the control logic 125.

The read and write circuit 123 may read page data DATA from the selected page of the memory cell array 100 during a program verify operation, and determine completion of the program operation of the read data.

The read and write circuit 123 may respond to the control of the control logic 125, and control a bias applied to the bit lines BL coupled to the memory cell array 110. In more detail, the read and write circuit 123 may selectively apply a program permit voltage or a program prevent voltage to the bit lines BL according to the control of the control logic 125. In various embodiments, the read and write circuit 123 may apply a program control voltage to the bit lines BL.

The input/output buffer 124 may be coupled to the read and write circuit 123 through data lines DL. The input/output buffer 124 may operate responding to the control of the control logic 125. The input/output buffer 124 may receive the data DATA stored from a controller 200 during the program operation.

The control logic 125 may be configured to control an operation of the semiconductor memory device 100. The control logic 125 may receive a command CMD and the physical block address PA. During the read operation, the command CMD may be the read command. During the program operation, the command CMD may be the command representing the program operation. During the delete operation, the command CMD may be the command representing the delete operation. The control logic 125 may be configured to control the address decoder 121, the voltage generator 122, the read and write circuit 123, and the input/output buffer 124, and the program mode setting unit 126 responding to the received command CMD.

The program operation may be performed through a plurality of program loops. The program loop may apply the program voltage to the selected word line, and include operations which verify a program status of the memory cells. The operation which verifies the program status may apply a program verification voltage to the selected word lines, read the page data DATA from the selected page, and determine whether the program of the read data is completed.

The control logic 125 may determine the voltage applied to the bit lines BL coupled to the memory cell array 110 by controlling the read and write circuit 123 according to a result of the program verify operation. The control logic 125 may control the read and write circuit 123 to selectively applying the program permit voltage or the program prevent voltage to each of the bit lines BL according to a program status of the memory cells.

The program mode setting unit 126 may set a program mode according to a target program status of the memory cells coupled to the word line WL of the memory cell array 110. The control logic 125 may control the read and write circuit 123 to selectively applying the program permit voltage or the program prevent voltage to each of the bit lines BL according to a program status of the program mode setting unit 126.

The plurality of memory cells coupled to the selected word line may have their own target program status. In various embodiments, the target program status may have a first program status PV1 to an n-th program status PVN. Each of the program status may be classified on the basis of threshold voltage of the memory cell. The memory cells having lower program status as the target program status may be programmed to have lower threshold voltage than the memory cells having the high memory program status as the target program status. In the present specification, program of a TLC method (that is, N is seven) storing three bit in one memory cell is described as an example, but it is for the convenience of explanation and not limited to the memory cells programmed by the TLC method.

The control logic 125 may apply the program voltage to the selected word line WL, and a pass voltage to the non-selected word lines WL during the program operation. While the control logic 125 applies the program voltage or the pass voltage to the word lines WL during the program operation, the control logic 125 may control the read and write circuit 123 to apply the program permit voltage or the program prevent voltage to the bit lines BL according to the setting status of the program mode setting unit 126.

The memory cell of a program permit mode may be provided with a program permit voltage through the bit lines BL, to which the memory cell of the program permit mode is coupled. A level of the program permit voltage may be a ground voltage level 0V.

The memory cell of a program inhibit mode may be provided with a program inhibit voltage through the bit lines BL, to which the memory cell of the program inhibit mode is coupled. The level of the program prevent voltage may be a power voltage level Vcc.

According to an embodiment of the present invention, the program mode setting unit 126 may set the memory cells included in the first memory cell group among the plurality of memory cells included in the memory cell array 110 to the program permit mode. The program mode setting unit 126 may set the memory cells included in the second memory cell group among the plurality of memory cells included in the memory cell array 110 to the program inhibit mode.

In various embodiments, the first memory cell group may include the memory cells each having a target program status among first to m-th program statuses PV1 to PVm of "n" program statuses PV1 to PVn (i.e., 7 program statuses PV1 to PV7). The second memory cell group may include the memory cells each having a target program status among (m+1)th to n-th program statuses PV(m+1) to PVn of "n" program statuses PV1 to PVn. A value of m may be set variously according to an embodiment.

The program mode setting unit 126 may change the program permit mode of the memory cells to the program inhibit mode according to the program verification result. The success of the program verification may represent that the threshold voltage of the memory cell reaches its target program status. The failure of the program verification may represent that the threshold voltage of the memory cells does not reach its target program status.

During the program operation, when the program mode setting unit 126 succeeds in the program verification on the i-th program status (1≤i≤7) as the target program status during the program verify operation, the program mode setting unit 126 may set the memory cell having the (i+k)th program status (i.e., k=3) as its target program status to the program permit mode while setting the memory cells having the i-th program status as the target program status or the memory cells of the verification success to the program inhibit mode.

According to another embodiment, the program mode setting unit 126 may have the plurality of program mode sets (i.e., first to third program mode sets). The voltage applied to the bit lines may depend on the plural program mode sets.

Each of the first to third program mode sets may define the program permit mode and the program inhibit mode for each memory cell subject to the program operation such that the memory cells of one or more predetermine target program statuses are set to the program permit mode while the other memory cells being set to the program inhibit mode. Each memory cell may have its own target program status among the "n" program statuses PV1 to PVn. The program operation may be performed such that the threshold voltage of each memory cell reaches the corresponding target program status.

During the program operation, the memory cell of the program permit mode may be provided with the program permit voltage through the bit lines BL, to which the memory cell of the program permit mode is coupled, while the memory cell of the program inhibit mode may be provided with the program inhibit voltage through the bit lines BL, to which the memory cell of the program inhibit mode is coupled, according to each of the first to third program mode sets.

According to an embodiment of the present Invention, the program mode setting unit 126 may change the first to third program mode sets of the program operation from one to another according to the result of the program verification on a predetermined target program status. For example, the program mode setting unit 126 may change the program mode set of the program operation from the first program mode to the second program mode upon success of the program verification on the second program status PV2 as the target program status. For example, the program mode setting unit 126 may change the program mode set of the program operation from the second program mode to the third program mode upon success of the program verification on the fourth program status PV4 as the target program status.

According to another embodiment of the present invention, the program mode setting unit 126 may change the first to third program mode sets of the program operation from one to another according to a predetermined number of applied program pulses. For example, the program mode setting unit 126 may change the program mode set of the program operation from the first program mode to the second program mode when the number of applied program pulses reaches a one-third of total number of applicable program pulses. For example, the program mode setting unit 126 may change the program mode set of the program operation from the second program mode to the third program mode when the number of applied program pulses reaches a two-thirds of total number of applicable program pulses.

Hereafter, a pass disturb will be described through FIGS. 4 and 5.

Figure 4:
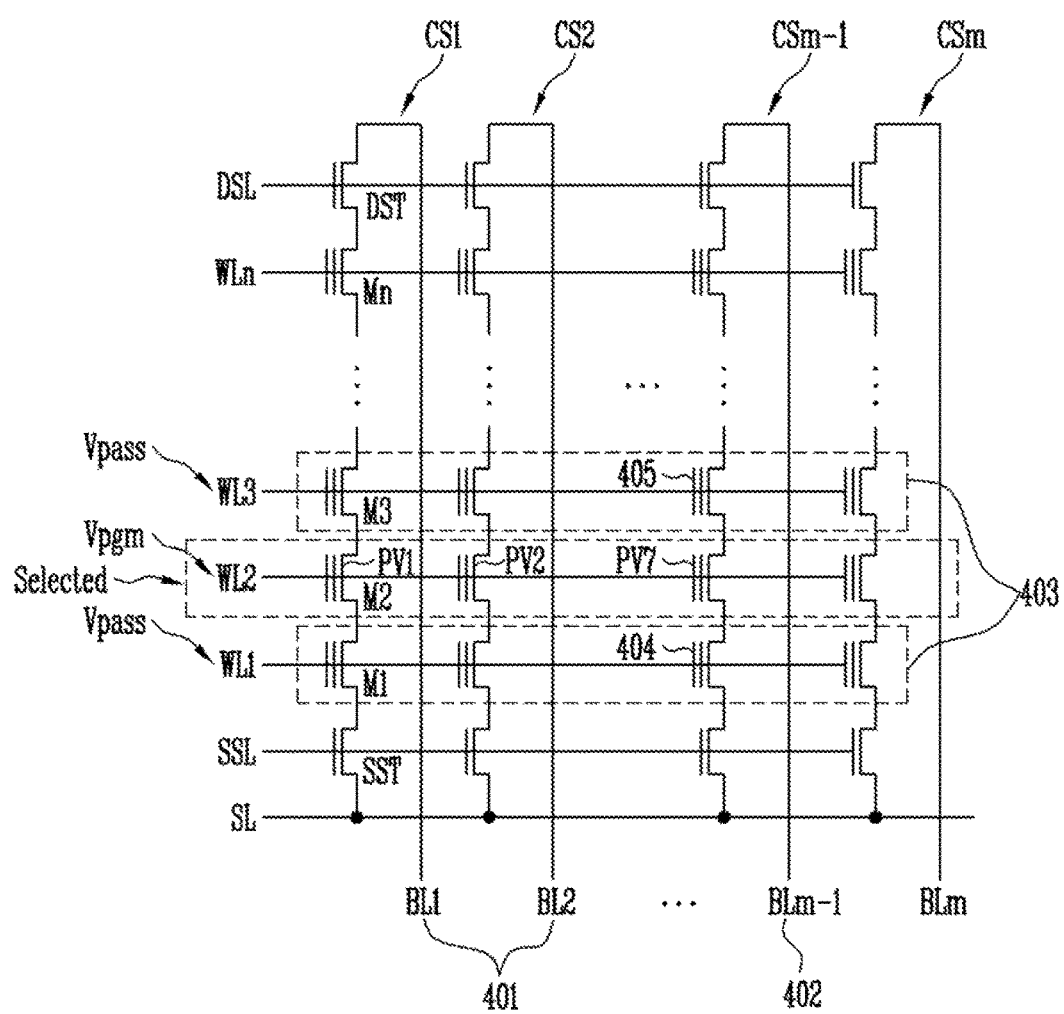
FIG. 4 is a diagram illustrating voltages applied to word lines and a pass disturb thereof during a program operation.

FIG. 4 is a diagram Illustrating voltages applied to word lines and a pass disturb thereof during the program operation.

FIG. 4 may represent the plurality of memory cell strings CS1 to CSm included in one memory block. The "m" cell strings CS1 to CSm may be coupled to the "m" bit lines BL1 to BLm.

Each of the first to m-th cell strings CS1 to CSm may include a drain selecting transistor DST, a plurality of memory cells M1 to Mn coupled in series, and a source selecting transistor SST. The drain selecting transistor DST may be coupled to a drain selecting line DSL. Each of the first to n-th memory cell M1 to Mn may be coupled to the first to n-th lines WL1 to WLn. The source selecting transistor SST may be coupled to the source selecting lines SSL. The drain side of the drain selecting transistor DST may be coupled to corresponding bit line. Drain transistors of the first to n-th cell strings CS1 to CSm may be coupled to the first to m-th bit lines BL1 to BLm, respectively. The source side of the source selecting transistor may be coupled to the common source line CSL.

Referring to FIG. 4, the word line WL selected for performing the program is a second word line WL2. The plurality of memory cells coupled to the second word line WL2 may constitute one page. Each of the memory cells coupled to the second word line WL may have the first program status PV1, the second program status PV2, and the seventh program status PV7 as the target program status.

A program voltage Vpgm may be applied to the second word line WL2 selected during the program operation. In addition, a program verify voltage Vvrfy may be applied to the word line WL2 selected according to the program operation. When a program voltage Vpgm and the program verify voltage Vvrfy are applied to the selected word line WL2, a pass voltage Vpass may be applied to the non-selected word lines. A change of the threshold voltage of the memory cells coupled to the non-selected word lines may be prevented by applying each the pass voltage Vpass to the word lines WL1 and WL3 adjacent to the selected word line WL2. The program permit voltage (for example: 0V) may be applied so that the memory cells coupled to the selected word line may be programmed in each of the bit lines. In other words, since the bit lines are commonly coupled to the first to m-th cell strings CS1 to CSm, program permit voltage may be applied during the program operation. In addition, the program prevent voltage may be sequentially applied to the bit lines in which completely programmed cell as the program operation proceeds are coupled. While performing the program operation, the pass voltage Vpass may be continuously applied to the memory cells 403 coupled to the non-selected word lines WL3 and WL1 adjacent to the selected word line WL2. Accordingly, the pass voltage Vpass may be repeatedly applied to a gate electrode, and the program permit voltage may be repeatedly applied to the bit line, the threshold voltage of the memory cells 403 coupled to the non-selected word lines WL1 and WL3 may increase. The phenomenon is referred to a pass disturb. Particularly, in the memory cells 404 and 405 adjacent to the selected word line W2 coupled to the bit line BLm-1 in which the memory cells having the high target program status are coupled, the pass disturb may occur for relatively long time until the program inhibit voltage is applied to the bit line. Accordingly, the threshold voltage of the memory cells 404 and 405 adjacent to the selected word line may be changed and the reliability of the semiconductor memory device may be reduced.

Figure 5:
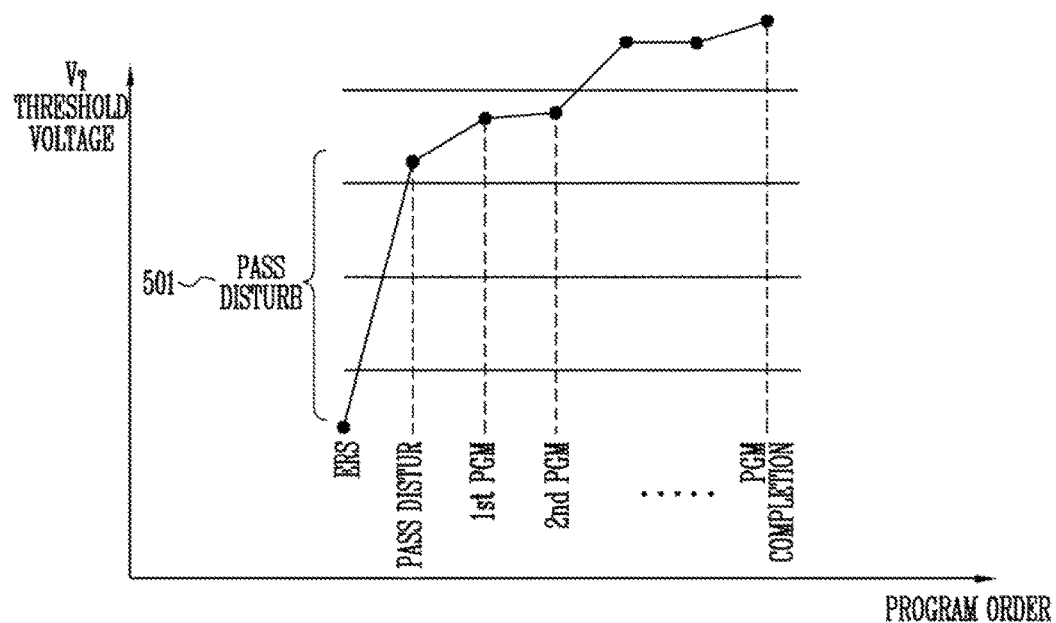
FIG. 5 is a graph illustrating a change of a threshold voltage of memory cells, which are adjacent to a selected word line and have an erase status, during a program operation.

FIG. 5 is a graph illustrating a change of the threshold voltage of memory cells, which are adjacent to the selected word line and have an erase status, during the program operation.

FIG. 5 illustrates the effect of the pass disturb of memory cells 404 and 405 adjacent to the selected word line described in FIG. 4. In detail, FIG. 5 illustrates the threshold voltage change having the low threshold voltage in which the memory cells adjacent to the selected word line have an erase status ERS.

According to FIG. 5, at the early program stage, a threshold voltage of the memory cells, which are adjacent to the selected word line and in an erase status (ERS), may increase when a first program operation (1st PGM), which programs the memory cells of the selected word line to the first program status, and a second program operation (2nd PGM), which programs the memory cells of the selected word line to the second program status, are performed.

FIG. 6 is a diagram illustrating a voltage applied to bit lines for a target program status of memory cells during the program operation.

Referring to FIG. 6, the program operation may comprise a program early stage 610, a program middle stage 620, and a program late stage 630. The bit lines may be coupled to the memory cells each having the target program status among the first to seventh program statures PV1 to PV7.

At start of the program early stage 610 the memory cell are not programmed yet, and thus are set as the program permit mode PGM MODE and provided with the program permit voltage. Therefore, the program permit voltage may be applied to the bit lines, to which the memory cells 601 having the third and fourth program statuses PV3 and PV4 as the target program statuses and the memory cells 603 having the fifth to seventh program statuses PV5 to PV7 are coupled. Accordingly, the pass disturb phenomenon may occur in the memory cells adjacent to the memory cells 601 and 603 having the third to seventh program statuses PV3 to PV7 as the target program status, which are high in voltage level.

As a result of the program early stage 610, the program of the memory cells having the first and second program statuses PV1 and PV2 as the target program status may be completed upon success of the verification on the first and second program statuses PV1 and PV2 as the target program status. Accordingly, the memory cells having the first and second program statuses PV1 and PV2 as the target program status are set to the program inhibit mode INHIBIT MODE. The program inhibit voltage is provided to the bit lines, to which the memory cells having the first and second program statuses PV1 and PV2 as the target program status are coupled.

During the program middle stage 620, the memory cells 601 and 603 having the third to seventh program statuses PV3 to PV7 remain set to the program permit mode PGM MODE, and are provided with the program permit voltage again. Accordingly, the pass disturb phenomenon may still occur in the memory cells adjacent to the memory cells 601 and 603 having the third to seventh program statuses PV3 to PV7 as the target program status.

As a result of the program middle stage 620, the program of the memory cells having the third and fourth program statuses PV3 and PV4 as the target program status may be completed upon success of the verification on the third and fourth program statuses PV3 and PV4 as the target program status. Accordingly, the memory cells having the third and fourth program statuses PV3 and PV4 as the target program status are set to the program inhibit mode INHIBIT MODE. The program inhibit voltage is provided to the bit lines, to which the memory cells having the first to fourth program statuses PV1 to PV4 as the target program status are coupled.

During the program late stage 630, the memory cells 603 having the fifth to seventh program statuses PV5 to PV7 remain set to the program permit mode PGM MODE, and are provided with the program permit voltage still again. Accordingly, the pass disturb phenomenon may still occur in the memory cells adjacent to the memory cells 603 having the fifth to seventh program statuses PV5 to PV7 as the target program status.

FIG. 7 is flow chart illustrating an operating method of the semiconductor memory device according to an embodiment of the present disclosure.

Referring to FIG. 7, at step 701, the semiconductor memory device 100 may set the memory cells of the first memory cell group to the program permit mode among the plurality of memory cells coupled to the selected word lines in the memory cell array 110. Also, the semiconductor memory device 100 may set the memory cells of the second memory cell group to the program inhibit mode among the plurality of memory cells coupled to the selected word lines in the memory cell array 110. As exemplified above, the first memory cell group may include the memory cells each having the target program status among first to m-th program statuses PV1 to PVm of "n" program statuses PV1 to PVn. The second memory cell group may include the memory cells each having the target program status among (m+1)th to n-th program statuses PV(m+1) to PVn of "n" program statuses PV1 to PVn. As an embodiment, m may be 3 (three). The value of m may be selected variously according to an embodiment.

At step 703, the semiconductor memory device 100 may perform the program operation to the plurality of memory cells coupled to the selected word lines among the "n" program statuses PV1 to PVn. When the program pulse is applied to the word line selected during the program operation, each different voltage may be applied to the bit lines of the memory cells coupled to the selected word according to the program mode sets.

In more detail, the program permit voltage may be applied to the bit lines of the memory cells of the program permit mode while the program inhibit voltage is applied to the bit line of the memory cells of the program inhibit mode. The level of the program permit voltage may be the ground voltage level (0V). The level of the program prevent voltage may be the power voltage level (Vcc), At step 705, the semiconductor memory device 100 may perform the verification operation to the memory cell having of i-th program status as the target program status. As described above, the success of the program verification may represent that the threshold voltage of the memory cell reaches its target program status. The failure of the program verification may represent that the threshold voltage of the memory cells does not reach its target program status.

As result of the verification operation of step 705, when the program verification on the memory cells having the i-th program status as the target program status fails, the semiconductor memory device may return to step 703 and apply the program pulse to the selected word line. An increase step pulse program ISPP method is used.

As result of the verification operation of step 705, when the program verification on the memory cells having the i-th program status as the target program status succeeds, the semiconductor memory device may proceed to step 707.

At the 707 stage, the semiconductor memory device 100 may determine whether the program operation to the memory cells coupled to the selected word line is completed. As a result of determination, when the program operation to all of the memory cells coupled to the selected word line are completed, the process may end. When the program operation to all of the memory cells is not completed yet, the semiconductor memory device may proceed to step 709.

At step 709, the semiconductor memory device 100 may set the memory cells having the (i+k)th program status as the target program status to the program permit mode. In an embodiment, the values of i and k may be a natural number or an integer. In an embodiment, k may be three (3).

Step 709 may be optional. Step 709 may be skipped when there is no memory cell having the (i+k)th program status as the target program status.

As to the memory cells having the next program status or the memory cells having the (i+1)th program status (step S711) as the target program status, the semiconductor memory device 100 may repeat steps 703 to 711.

FIG. 10 is a diagram illustrating a voltage applied to a bit line when the semiconductor memory device operates according to an embodiment of FIG. 7.

The TLC method which stores three bits of data in one memory cell is described as an example in FIG. 10. However, an embodiment of the present disclosure may be applied to methods (MLC or QLC) which stores an arbitrary number of bit in one memory cell as described above, and it is clearly specified that the an embodiment of the present disclosure may be not limited to the memory cell programmed in the TLC method.

Referring to FIG. 10, the semiconductor memory device 100 may perform the program operation for the target program status of the "n" program statuses PV1 to PVn in ascending order.

According to the embodiment, when the semiconductor memory device 100 succeeds in the program verification on the i-th program status as the target program status during the program verify operation, the semiconductor memory device 100 may set the memory cell having the (i+k)th program status as its target program status to the program permit mode PGM MODE while setting the memory cells having the i-th program status as the target program status or the memory cells of the verification success to the program inhibit mode INHIBIT MODE.

Initially, the semiconductor memory device 100 may set the memory cells of the first memory cell group to the program permit mode PGM MODE among the plurality of memory cells coupled to the selected word lines in the memory cell array 110. Also, the semiconductor memory device 100 may set the memory cells of the second memory cell group to the program inhibit mode INHIBIT MODE among the plurality of memory cells coupled to the selected word lines in the memory cell array 110. The memory cells of the first memory cell group may have the first to third program statuses PV1 to PV3 as the target program status and the memory cells of the second memory cell group may have the fourth to seventh program statuses PV4 to PV7 as the target program status.

As the program operation proceeds, the program permit voltage may be applied to the bit lines of the memory cells of the program permit mode while the program inhibit voltage is applied to the bit line of the memory cells of the program inhibit mode.

When the program verification on the memory cells having the i-th program status (i.e., the first program status PV1) as the target program status succeeds, the semiconductor memory device 100 may set the memory cells having the i-th program status (i.e., the first program status PV1) as the target program status or the memory cells of the verification success to the program inhibit mode INHIBIT MODE while the semiconductor memory device 100 may set the memory cells having the (i+k)th program status (the fourth program status PV4: k=3) as the target program status to the program permit mode PGM MODE.

As such, as the semiconductor memory device 100 succeeds in the program verification on the i-th program status (i.e., the first to third program statuses PV1 to PV3 in sequence) as the target program status during the program verify operation, the semiconductor memory device 100 may set the memory cell having the (i+k)th program status (i.e., the fourth to sixth program statuses PV4 to PV6 in sequence) as its target program status to the program permit mode PGM MODE while setting the memory cells having the i-th program status (i.e., the first to third program statuses PV1 to PV3 in sequence) as the target program status or the memory cells of the verification success to the program inhibit mode INHIBIT MODE.

For example, when the semiconductor memory device 100 succeeds in the program verification on the fourth program status PV4 as the target program status during the program verify operation, the semiconductor memory device 100 may set the memory cell having the seventh program status PV7 as its target program status to the program permit mode PGM MODE while setting the memory cells having the fourth program status PV4 as the target program status or the memory cells of the verification success to the program inhibit mode INHIBIT MODE.

As the semiconductor memory device 100 succeeds in the program verification on the fifth to seventh program statuses PV5 to PV7 as the target program status during the program verify operation, the semiconductor memory device 100 may set the memory cells having the fifth to seventh program statuses PV5 to PV7 as the target program status or the memory cells of the verification success to the program inhibit mode INHIBIT MODE. As described above, step 709 may be skipped when there is no memory cell having the (i+k)th program status as the target program status.

As such, the memory cells having the program statuses of higher levels (i.e., the (n+k)th program statuses) as the target program status may set to the program inhibit mode INHIBIT MODE during the program operation to the memory cells having the program statuses of lower levels (i.e. the i-th program status). Accordingly, the pass disturb of the memory cells of the memory cells having the program statuses of higher levels (i.e., the (n+k)th program statuses) as the target program status may be reduced.

Figure 9:
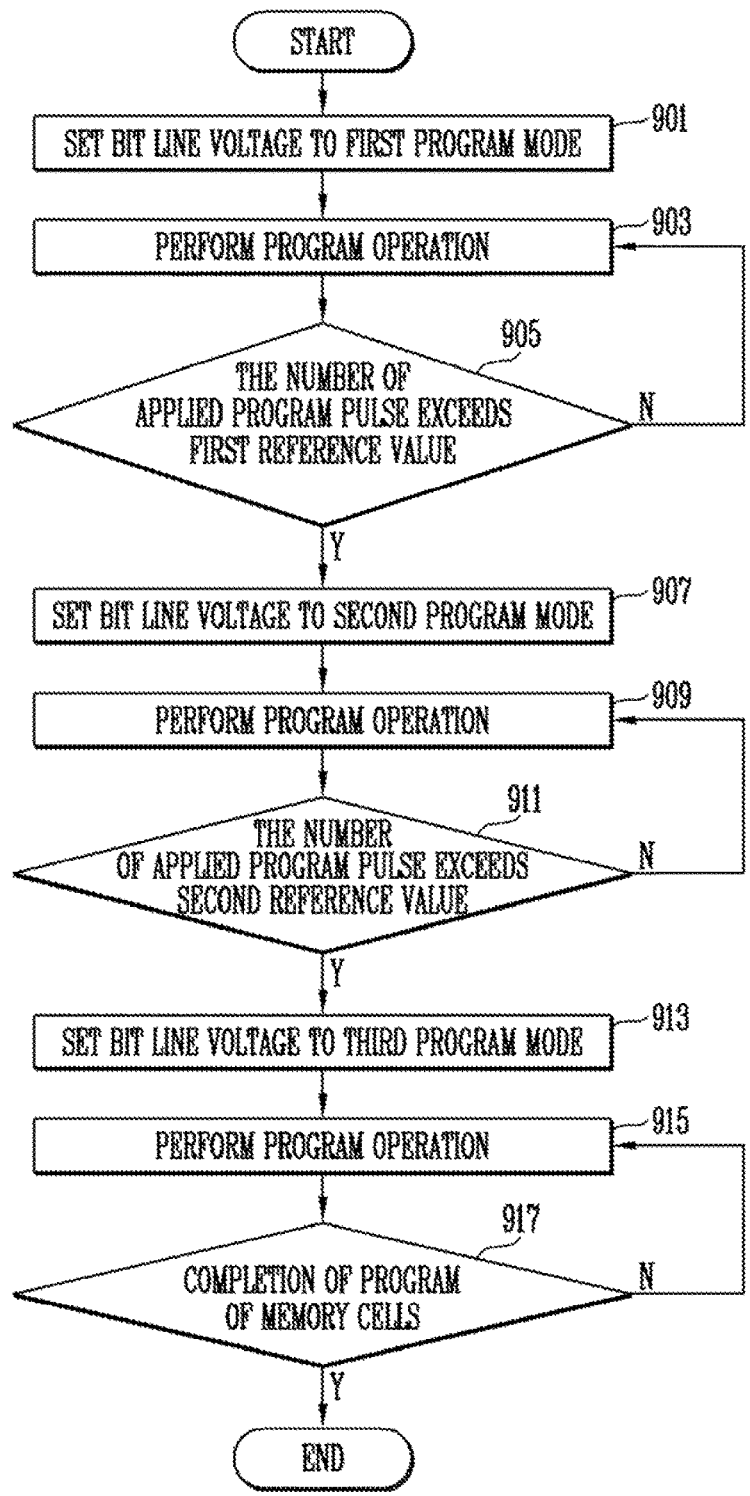
FIG. 9 is a flow chart illustrating an operating method of a semiconductor memory device according to another embodiment of the present disclosure.

FIGS. 8 and 9 are flow charts illustrating operating methods of the semiconductor memory device according to embodiments of the present disclosure.

According to embodiments described with reference to FIGS. 8 to 9, the semiconductor memory device 100 may have the plurality of program mode sets (i.e. first to third program mode sets) each defining voltages to be applied to the bit lines of the memory cells coupled to the selected word line.

Each of the first to third program mode sets may define the program modes for the target program statuses PV1 to PVn of the memory cells. In detail, each of the first to third program mode sets may define the program permit mode for a part of the memory cells coupled to the selected word line having particular program statuses, and the program inhibit program status for the other part of the memory cells coupled to the selected word line having the rest of the program statuses among the "n" program statuses PV1 to PVn.

For example, the first program mode set may define the memory cells having the target program statuses of the first to third program statuses PV1 to PV3 as the program permit mode; and may define the memory cells having the target program statuses of the fourth to seventh program statuses PV4 to PV7 as the program inhibit mode.

For example, the second program mode set may define the memory cells having the target program statuses of the first, second, sixth and seventh program statuses PV1, PV2, PV6 and PV7 as the program inhibit mode; and may define the memory cells having the target program statuses of the third to fifth program statuses PV3 to PV5 as the program permit mode.

For example, the third program mode set may define the memory cells having the target program statuses of the first to fourth program statuses PV1 to PV4 as the program inhibit mode; and may define the memory cells having the target program statuses of the fifth to seventh program statuses PV5 to PV7 as the program permit mode.

The program operation may comprise the early, middle and late program stages respectively corresponding to the first to third program mode sets.

However, the embodiment of the present invention is not limited to the program mode sets exemplified above.

According to each of the first to third program mode sets during the program operation, the memory cell of the program permit mode may be provided with the program permit voltage through the bit lines BL, to which the memory cell of the program permit mode is coupled, while the memory cell of the program inhibit mode may be provided with the program inhibit voltage through the bit lines BL, to which the memory cell of the program inhibit mode is coupled.

According to an embodiment of the present invention, the program mode setting unit 126 may change the first to third program mode sets of the program operation from one to another according to the result of the program verification on a predetermined target program status, as described with reference to FIGS. 8 and 11. For example, the program mode setting unit 126 may change the program mode set of the program operation from the first program mode to the second program mode upon success of the program verification on the second program status PV2 as the target program status. For example, the program mode setting unit 126 may change the program mode set of the program operation from the second program mode to the third program mode upon success of the program verification on the fourth program status PV4 as the target program status.

Referring to FIG. 8, at step 801, the semiconductor memory device 100 may set the voltage of the bit lines of the memory cells coupled to the selected word line to the first program mode set.

At step 803, the semiconductor memory device 100 may apply a program pulse to the selected word line and a pass voltage to the unselected word lines. The semiconductor memory device 100 may apply the program inhibit voltage and the program permit voltage to the bit lines according to the first program mode set. According to the first program mode set, the program permit voltage may be applied to the bit lines of the memory cells having the target program statuses of the first to third program statuses PV1 to PV3, and the program inhibit voltage may be applied to the bit lines of the memory cells having the target program statuses of the fourth to seventh program statuses PV4 to PV7.

At step 805, the semiconductor memory device 100 may perform the verification operation to the memory cell having of p-th program status PVp as the target program status. As described above, the success of the program verification may represent that the threshold voltage of the memory cell reaches its target program status. The failure of the program verification may represent that the threshold voltage of the memory cells does not reach its target program status. In an embodiment, the p-th program status PVp may be the second program status PV2.

As a result of the verification operation of step 805, when the program verification on the p-th program status PVp (e.g., the second program status PV2) falls, the semiconductor memory device 100 may repeat step 803 with another program pulse. The increase step pulse program ISPP method may be used. As a result of the verification operation of step 805, when the program verification on the p-th program status PVp (e.g., the second program status PV2) succeeds, the semiconductor memory device may proceed to step 807.

At steps 807 to 811, the semiconductor memory device 100 repeat the program operation described with reference to steps 801 to 805 with the second program mode set.

According to the second program mode set, the program inhibit voltage may be applied to the bit lines of the memory cells having the target program statuses of the first, second, sixth and seventh program statuses PV1, PV2, PV6 and PV7, and the program permit voltage may be applied to the bit lines of the memory cells having the target program statuses of the third to fifth program statuses PV3 to PV5.

At step 811, the semiconductor memory device 100 may perform the verification operation to the memory cell having of q-th program status PVq as the target program status. In an embodiment, the q-th program status PVq may be the second program status PV4.

At steps 813 to 817, the semiconductor memory device 100 repeat the program operation described with reference to steps 801 to 805 or steps 807 to 811 with the third program mode set.

According to the third program mode set, the program inhibit voltage may be applied to the bit lines of the memory cells having the target program statuses of the first to fourth program statuses PV1 to PV4, and the program permit voltage may be applied to the bit lines of the memory cells having the target program statuses of the fifth to seventh program statuses PV5 to PV7.

At step 817, the semiconductor memory device 100 may determine whether the program operation to the memory cells coupled to the selected word line is complete. It is determined by the program verification on the memory cells having a highest program status as the target program status whether the program of the memory cells is completed. When the program verification fails as a result of determination, the semiconductor memory device may return to step 815 and apply the program pulse to the selected word line. The increase step pulse program ISPP method may be used. When the program verification succeeds as a result of determination in step 817, the program may be completed.

Figure 11:
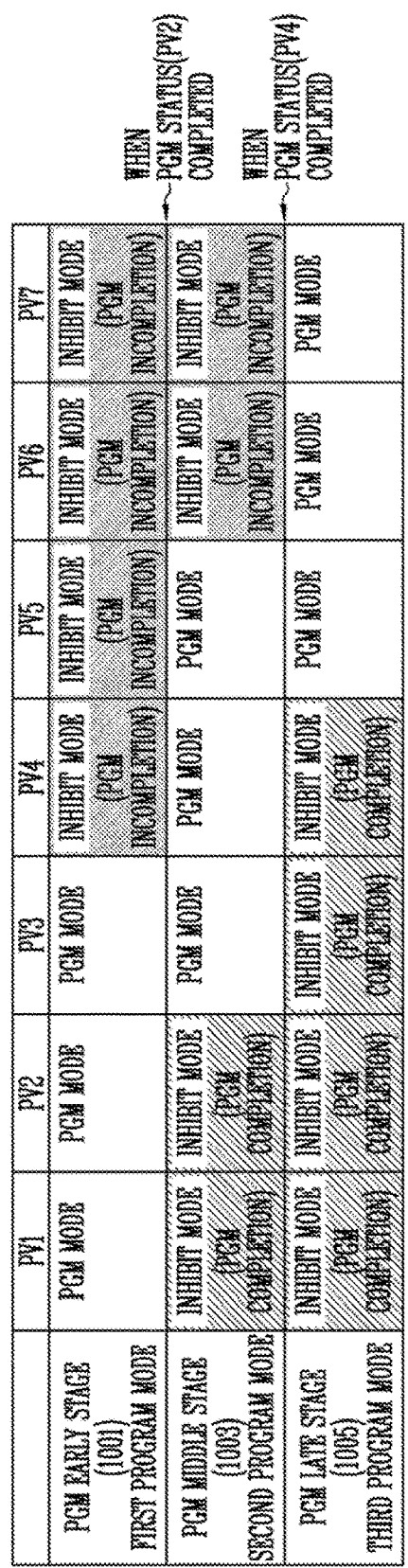
FIG. 11 is a diagram Illustrating a voltage applied to a bit line when a semiconductor memory device operates according to an embodiment of FIG. 8.

FIG. 11 is a diagram Illustrating a voltage applied to a bit line when the semiconductor memory device operated according to an embodiment of FIG. 8.

The TLC method which stores three bits of data in one memory cell is described as an example in FIG. 11. However, an embodiment of the present disclosure may be applied to methods (MLC or QLC) which stores an arbitrary number of bit in one memory cell as described above, and it is clearly specified that the an embodiment of the present disclosure may be not limited to the memory cell programmed in the TLC method.

Referring to FIG. 11, the semiconductor memory device 100 may perform the program operation according to the first to third program mode sets respectively corresponding to the early, middle and late program stages 1001 to 1005.

At the early program stage 1001 corresponding to the first program mode set, the program permit voltage may be applied to the bit lines of the memory cells having the first to third program statuses PV1 to PV3 as the target program status, and the program inhibit voltage may be applied to the bit lines of the memory cells having the fourth to seventh program statuses PV4 to PV7 as the target program status. Accordingly, since the program inhibit voltage is applied to the bit lines coupled the memory cells having the fourth program status PV4 to the seventh program status PV7 as the target program status, the pass disturb phenomenon of the memory cells adjacent to each other may be blocked.

As a result of the program early stage 1001, the program of the memory cells having the first and second program statuses PV1 and PV2 as the target program status may be completed upon success of the verification on the first and second program statuses PV1 and PV2 as the target program status.

At the middle program stage 1003 corresponding to the second program mode set, the program inhibit voltage may be applied to the bit lines of the memory cells having the first, second, sixth and seventh program statuses PV1, PV2, PV6 and PV7 as the target program status, and the program permit voltage may be applied to the bit lines of the memory cells having the third to fifth program statuses PV3 to PV5 as the target program status. Accordingly, since the program inhibit voltage is applied to the bit lines coupled the memory cells having the fourth program status PV4 to the seventh program status PV7 as the target program status, the pass disturb phenomenon of the memory cells adjacent to each other may be blocked.

As a result of the program middle stage 1003, the program of the memory cells having the third and fourth program statuses PV3 and PV4 as the target program status may be completed upon success of the verification on the third and fourth program statuses PV3 and PV4 as the target program status.

At the late program stage 1005 corresponding to the third program mode set, the program inhibit voltage may be applied to the bit lines of the memory cells having the first to fourth program statuses PV1 to PV4 as the target program status, and the program permit voltage may be applied to the bit lines of the memory cells having the fifth to seventh program statuses PV5 to PV7 as the target program status.

In an embodiment of FIGS. 8 and 11, the semiconductor memory device 100 may change the program mode set of the program operation from the first program mode set to the second program mode set when the program operation of the second program status PV2 is completed. In addition, the semiconductor memory device 100 may change the program mode of the program operation from the second program mode set to the third program mode set when the program operation of the fourth program status PV4 is completed.

According to another embodiment of the present invention, the program mode setting unit 126 may change the first to third program mode sets of the program operation from one to another according to a predetermined number of applied program pulses as describe with reference to FIGS. 9 and 11. For example, the program mode setting unit 126 may change the program mode set of the program operation from the first program mode to the second program mode when the number of applied program pulses reaches a first reference number (i.e., one-third of total number of applicable program pulses). For example, the program mode setting unit 126 may change the program mode set of the program operation from the second program mode to the third program mode when the number of applied program pulses reaches a second reference number (i.e., two-thirds of total number of applicable program pulses).

Referring to FIG. 9, at step 901, the semiconductor memory device 100 may set the voltage of the bit lines of the memory cells coupled to the selected word line to the first program mode set.

At step 903, the semiconductor memory device 100 may apply a program pulse to the selected word line and a pass voltage to the unselected word lines. The semiconductor memory device 100 may apply the program inhibit voltage and the program permit voltage to the bit lines according to the first program mode set. According to the first program mode set, the program permit voltage may be applied to the bit lines of the memory cells having the target program statuses of the first to third program statuses PV1 to PV3, and the program inhibit voltage may be applied to the bit lines of the memory cells having the target program statuses of the fourth to seventh program statuses PV4 to PV7.

At step 905, the semiconductor memory device 100 may determine whether the number of applied program pulses reaches the first reference number (i.e., one-third of total number of applicable program pulses).

As a result of the determination operation of step 905, when the number of applied program pulses does not reach the first reference number (i.e., one-third of total number of applicable program pulses), the semiconductor memory device 100 may repeat step 903 with another program pulse. The increase step pulse program ISPP method may be used. As a result of the determination operation of step 905, when the number of applied program pulses reaches the first reference number (i.e., one-third of total number of applicable program pulses), the semiconductor memory device may proceed to step 907.

At steps 907 to 911, the semiconductor memory device 100 repeat the program operation described with reference to steps 901 to 905 with the second program mode set.

According to the second program mode set, the program inhibit voltage may be applied to the bit lines of the memory cells having the target program statuses of the first, second, sixth and seventh program statuses PV1, PV2, PV6 and PV7, and the program permit voltage may be applied to the bit lines of the memory cells having the target program statuses of the third to fifth program statuses PV3 to PV5.

At step 911, the semiconductor memory device 100 may determine whether the number of applied program pulses reaches the second reference number (i.e., two-thirds of total number of applicable program pulses).

At steps 913 to 917, the semiconductor memory device 100 repeat the program operation described with reference to steps 901 to 905 or steps 907 to 911 with the third program mode set.

According to the third program mode set, the program inhibit voltage may be applied to the bit lines of the memory cells having the target program statuses of the first to fourth program statuses PV1 to PV4, and the program permit voltage may be applied to the bit lines of the memory cells having the target program statuses of the fifth to seventh program statuses PV5 to PV7.

At step 917, the semiconductor memory device 100 may determine whether the program operation to the memory cells coupled to the selected word line is complete. It is determined whether the number of applied program pulses reaches a third reference number (i.e., total number of applicable program pulses). When the number of applied program pulses does not reach the third reference number (i.e., total number of applicable program pulses), the semiconductor memory device may return to step 815 and apply the program pulse to the selected word line. The increase step pulse program ISPP method may be used. When the number of applied program pulses reaches the third reference number (i.e., total number of applicable program pulses), the program may be completed.

FIG. 12 is a diagram illustrating a voltage applied to a bit line when the semiconductor memory device operated according to an embodiment of FIG. 9.

The TLC method which stores three bits of data in one memory cell is described as an example in FIG. 12. However, an embodiment of the present disclosure may be applied to methods (MLC or QLC) which stores an arbitrary number of bit in one memory cell as described above, and it is clearly specified that the an embodiment of the present disclosure may be not limited to the memory cell programmed in the TLC method.

Referring to FIG. 12, the semiconductor memory device 100 may perform the program operation according to the first to third program mode sets.

At the early program stage 1101 corresponding to the first program mode set, the program permit voltage may be applied to the bit lines of the memory cells having the first to third program statuses PV1 to PV3 as the target program status, and the program inhibit voltage may be applied to the bit lines of the memory cells having the fourth to seventh program statuses PV4 to PV7 as the target program status. Accordingly, since the program inhibit voltage is applied to the bit lines coupled the memory cells having the fourth program status PV4 to the seventh program status PV7 as the target program status, the pass disturb phenomenon of the memory cells adjacent to each other may be blocked.

As a result of the program early stage 1001, the program of the memory cells having the first and second program statuses PV1 and PV2 as the target program status may be completed upon success of the verification on the first and second program statuses PV1 and PV2 as the target program status.

At the middle program stage 1103 corresponding to the second program mode set, the program inhibit voltage may be applied to the bit lines of the memory cells having the first, second, sixth and seventh program statuses PV1, PV2, PV6 and PV7 as the target program status, and the program permit voltage may be applied to the bit lines of the memory cells having the third to fifth program statuses PV3 to PV5 as the target program status. Accordingly, since the program inhibit voltage is applied to the bit lines coupled the memory cells having the fourth program status PV4 to the seventh program status PV7 as the target program status, the pass disturb phenomenon of the memory cells adjacent to each other may be blocked.

As a result of the program middle stage 1103, the program of the memory cells having the third and fourth program statuses PV3 and PV4 as the target program status may be completed upon success of the verification on the third and fourth program statuses PV3 and PV4 as the target program status.

At the late program stage 1105 corresponding to the third program mode set, the program inhibit voltage may be applied to the bit lines of the memory cells having the first to fourth program statuses PV1 to PV4 as the target program status, and the program permit voltage may be applied to the bit lines of the memory cells having the fifth to seventh program statuses PV5 to PV7 as the target program status. Accordingly, since the program inhibit voltage is applied to the bit lines coupled the memory cells having the seventh program status PV7 as the target program status, the pass disturb phenomenon of the memory cells adjacent to each other may be blocked.

In an embodiment of FIGS. 9 and 12, the semiconductor memory device 100 may change the program mode set of the program operation from the first program mode set to the second program mode set when the number of applied program pulses reaches the first reference number (i.e., one-third of total number of applicable program pulses). In addition, the semiconductor memory device 100 may change the program mode of the program operation from the second program mode set to the third program mode set when the number of applied program pulses reaches the second reference number (i.e., two-thirds of total number of applicable program pulses).

According to an embodiment of FIGS. 9 and 12, since the semiconductor memory device 100 changes the program mode set according the predetermined first and second reference values, the bit line voltage may be set independently from the program verify operation.

Figure 13:
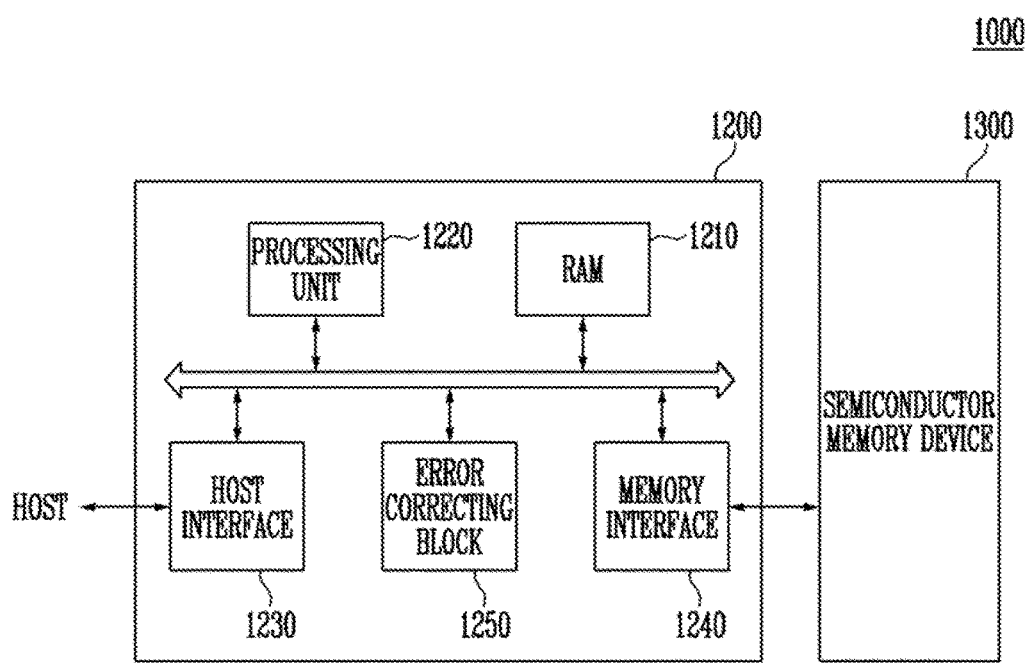
FIG. 13 is a block diagram illustrating an applied example of a memory system of FIG. 1.

FIG. 13 is block view illustrating an example of the memory system of FIG. 1.

Referring to FIG. 13, a memory system 1000 may include a semiconductor memory device 1300 and a controller 1200.

The semiconductor memory device 1300 may be configured as explained referring to FIG. 1 and operation, hence a description and operation of the semiconductor memory device 1300 will not be repeated herein.

The controller 1200 may be coupled to a host and the semiconductor memory device 12300. The controller 1200 may be configured to access the semiconductor memory device 1200 responding to a request from the host Host. For example, the controller 1200 may be configured to control a read operation, a program operation, a delete operation, and a background operation of the semiconductor memory device 1300. The controller 1200 may be configured to provide interface between the semiconductor memory device 1300 and the host Host. The controller may be configured to drive a firmware to control semiconductor memory device 1300.

The controller 1200 may include a random access memory (RAM) 1210, a processing unit 1220, host interface 1230, memory interface 1240 and an error correcting block 1250.

The RAM 1210 may be used as one of a driving memory of the processing unit 1220, the semiconductor memory device 1300, a cache memory between the hosts Host, and a buffer memory between the semiconductor memory device 1300 and the host Host.

The processing unit 1220 may control the operation of the controller 1200.

The processing unit 1220 may be configured to randomize the data received from the host Host. For example, the processing unit 1220 may randomize the data received from the host Host by using the randomizing seed. The randomized data may be provided to the semiconductor memory device 1100 as the data to be stored (DATA, please refer to FIG. 1) and programmed to the memory cell array (110, please refer to FIG. 1.)

The processing unit 1220 may be configured to derandomize the data received from the semiconductor device 1300 during the read operation. For example, the processing unit 1220 may derandomize the data received from the semiconductor memory device 1300 by using the derandomizing seed. The derandomized data may be output to the host Host.

As an embodiment, the processing unit 1220 may perform randomize and derandomized by driving a software of a firmware.

The host interface 1230 may include a protocol to perform the data exchange between the host Host and the controller 1200. As an exemplary embodiment, the controller 1200 may be configured to communicated with the host Host through one of the protocols, for example, an Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 1240 may interface with the semiconductor memory device 50. For example, the memory interface 1240 may include NAND interface or NOR interface.

The error correcting block 1250 may detect and correct the error of the data received from the semiconductor memory device 50 by using an error correcting code (ECC).

The controlled and the semiconductor memory device 1300 may be integrated as one semiconductor memory device. As an exemplary embodiment, the controller 1200 and the semiconductor memory device 1300 may be integrate as one semiconductor memory device and constitute a memory card. For example, the controller 1200 and the semiconductor memory device 1300 may be integrated as one semiconductor memory device and constitute the memory card, for example, a personal computer memory card international association (PCMCIA), a compact flash (CF) card, a smart media card (SM, SMC), a memory stick, a multimedia card (MMC, RS-MMC, MMCmicro), a SD card (SD, miniSD, microSD, SDHC), and an universal flash memory device (UFS)

The controller 1200 and the semiconductor memory device 1300 may be integrated as one semiconductor memory device and comprise a solid status drive (SSD). The SSD may include a storing device configured to store the data in the semiconductor memory device. When the memory system 1000 is used as a semiconductor drive SSD, a driving speed of the host Host coupled to the memory system 100 may be improved significantly.

As another example, the memory system 100 may be provided as one of the components, for example, one of computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device sending/receiving the information in a wireless environment, and various electronic apparatuses constituting a home network.

As an exemplary, the semiconductor memory device 1300 or the memory system 100 may be installed in various shape of packages. For example, the semiconductor memory device 1300 and the memory system 100 may be packaged and installed in the following method, for example, a package on package (PoP), a ball grid arrays (BGAs), a chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi-chip package (MCP), a wafer-level fabricated package (WFP), a wafer-level processed stack package (WSP).

Figure 14:
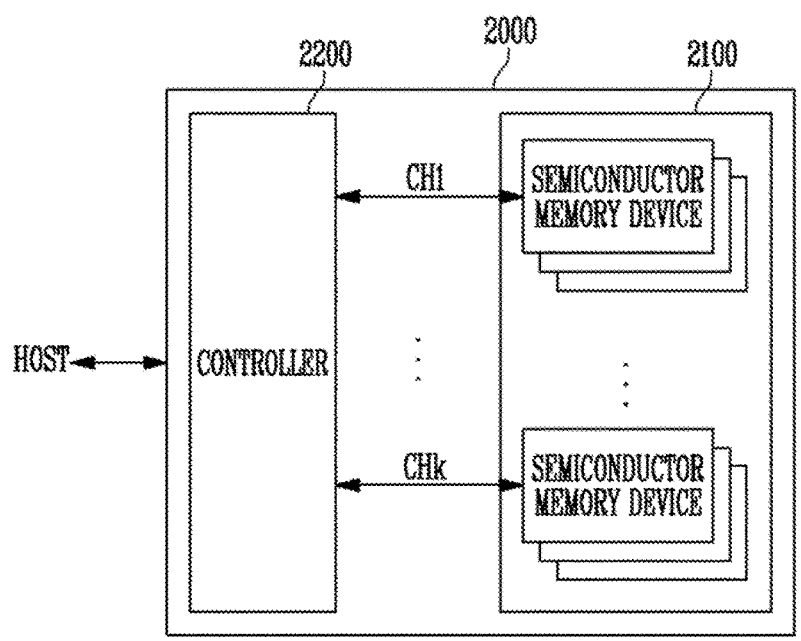
FIG. 14 is a block diagram illustrating an applied example of a memory system of FIG. 12.

FIG. 14 is block diagram illustrating an example 2000 of the memory system 1000 in FIG. 13.

Referring to FIG. 14, the memory system 200 may include the semiconductor memory device 2100 and the controller 2200. The semiconductor memory device 2100 may include a plurality of semiconductor memory chips. The plurality of memory chips may be divided into a plurality of groups.

In FIG. 14, each of the plurality of groups is Illustrated to communicate with the controller 2200 through the first to the kth channels CH1 to CHk. Each semiconductor memory chip may be configured to the same as one of the semiconductor memory device 50 described referring to FIG. 1 and operate.

Each group may be configured to communicate with the controller 2200 through the common channel. The controller 2200 may be configured to be the same as the controller 1200 described referring to FIG. 13 and control the plurality of memory chips of the semiconductor memory device 2100 through the plurality of channels CH1 to CHk.

In FIG. 14, it is described that the plurality of semiconductor memory chips are coupled to one channel. However, it is understood that the memory system 2000 may be changed so that one semiconductor memory device is coupled to one channel.

Figure 15:
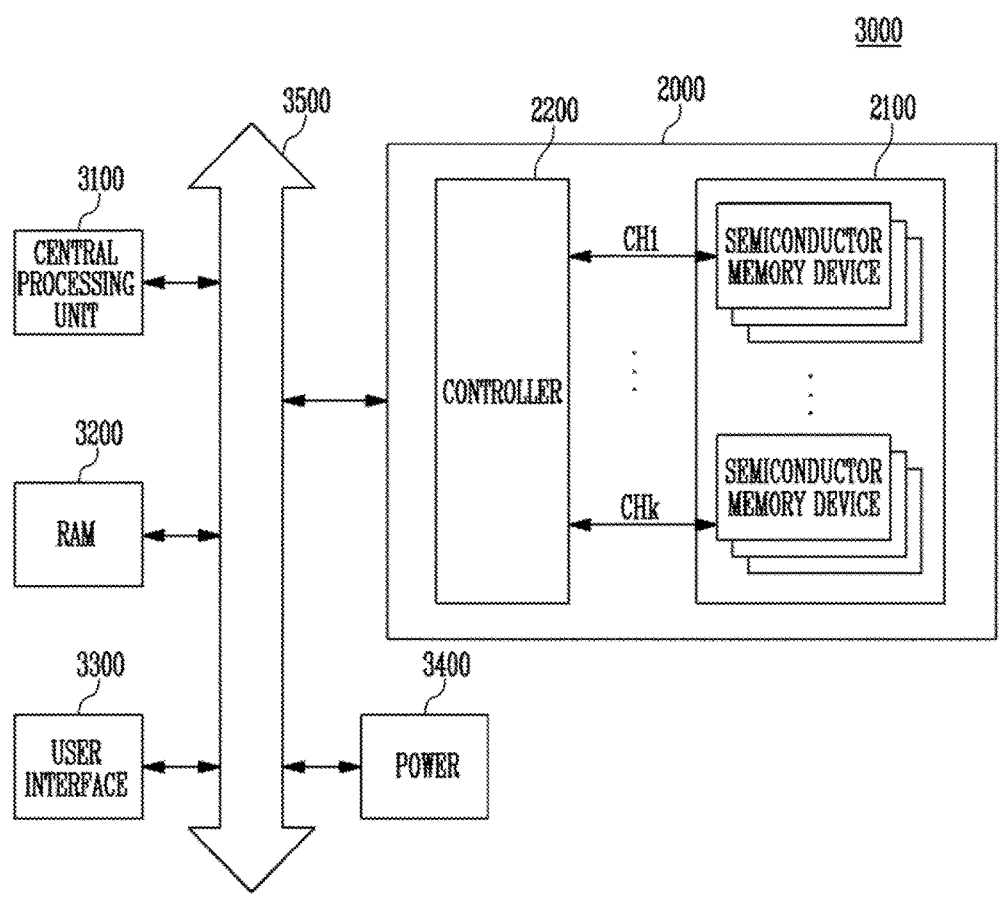
FIG. 15 is a block diagram Illustrating a computing system including a memory system described referring to FIG. 13.

FIG. 15 is a block view illustrating the computing system 3000 including the memory system 2000 described referring to FIG. 14.

Referring to FIG. 15, the computing system 3000 may include a central processing unit 3100, the random access memory (RAM) 3200, user interface 3300, a power 3400, system but 3500 and memory system 2000.

The memory system 2000 may be electrically coupled to the central processing unit 3100, the RAM 3200, and user interface 3300, and the power 3400 through the system bus 3500. The data provided through the user interface 3300 and processed by the central processing unit 3100 may store in the memory system 2000.

In FIG. 15, the semiconductor memory device 2100 is illustrated to be coupled to the system bus 3500 through the controller 2200. However, the semiconductor memory device 2100 may be configured to be directly coupled to the system bus 3500. Function of the controller 2200 may be performed by the central processing unit 3100 and the RAM 3200.

In FIG. 15, it is illustrated that the memory system 2000 described referring to FIG. 14 is provided. However, the memory system 2000 may be replaced with the memory system 1000 described referring to FIG. 7. As an embodiment, the computing system 3000 may be configured to include the memory systems 1000 and 2000 described referring to FIGS. 13 and 14.

According to an embodiment of the present disclosure, a semiconductor memory device with reliability and an operating method thereof are provided.

Exemplary embodiments of the present disclosure were described in detail with reference to the accompanying drawings. However, the present disclosure is not limited to the embodiments but may be implemented into different forms.

In described embodiments, all stages may be selectively performed or omitted. In addition, the stages in an embodiment may be not necessarily performed sequentially, but performed the other way around. Also features or elements described in relation to one embodiment may be employed with another embodiment as may be readily understood by those skilled in the relevant art. It will be understood by those of skill in the art that various changes in form and details may be made without departing from the spirit and scope of the present invention as set forth in the following claims.

What is claimed is:

1. An operating method of a semiconductor memory device including a plurality of memory cells each having one of "n" number of program statuses as a target program status, the operating method comprising:
   setting a first group of the memory cells, which have a first group of the program statuses as the target program status, to a program permit mode;
   setting a second group of the memory cells, which have a second group of the program statuses as the target program status, to a program inhibit mode;
   performing a program operation and a program verification operation to an i-th one of the "n" program statuses in ascending order of level of the program statuses; and
   immediately changing one or more of the memory cells of the first group of the memory cells having the i-th program status from the program permit mode to the program inhibit mode, and one or more of the memory cells of the second group of the memory cells having an (i+k)th program status to from the program inhibit mode to the program permit mode when the program verification operation to the i-th program status succeeds,
   wherein the k is an integer greater than or equal to 2.

2. The operating method of claim 1, wherein the performing of the program operation includes:
   providing a program permit voltage to the first group of the memory cells; and
   providing a program inhibit voltage to the second group of the memory cells.

3. The operating method of claim 1, wherein the changing comprises:
   determining the success of the program verification operation to the i-th program status when threshold voltages of the memory cells having the i-th program status reaches the i-th program status.

4. A semiconductor memory device, comprising:
   a plurality of memory cells each having one of "n" number of program statuses as a target program status; and
   a peripheral circuit configured to:
   set a first group of the memory cells, which have a first group of the program statuses as the target program status, to a program permit mode;
   set a second group of the memory cells, which have a second group of the program statuses as the target program status, to a program inhibit mode;
   perform a program operation and a program verification operation to an i-th one of the "n" program statuses in ascending order of level of the program statuses; and
   immediately change one or more of the memory cells of the first group of the memory cells having the i-th program status from the program permit mode to the program inhibit mode, and one or more of the memory cells of the second group of the memory cells having an (i+k)th program status to from the program inhibit mode to the program permit mode when the program verification operation to the i-th program status succeeds, wherein the k is an integer greater than or equal to 2.

5. The semiconductor memory device of claim 4, wherein the peripheral circuit provides a program permit voltage to the first group of the memory cells, and provides a program inhibit voltage to the second group of the memory cells during the program operation.

6. The semiconductor memory device of claim 4, wherein the peripheral circuit determines the success of the program verification operation to the i-th program status when threshold voltages of the memory cells having the i-th program status reaches the i-th program status during the changing.

* * * * *